United States Patent
Hashemi et al.

(10) Patent No.: US 11,165,017 B2
(45) Date of Patent: Nov. 2, 2021

(54) REPLACEMENT BOTTOM ELECTRODE STRUCTURE PROCESS TO FORM MISALIGNMENT TOLERATE MRAM WITH HIGH YIELD

(71) Applicant: International Business Machines Corporation, Armonk, NY (US)

(72) Inventors: Pouya Hashemi, Purchase, NY (US); Takashi Ando, Tuckahoe, NY (US); Dimitri Houssameddine, White Plains, NY (US); Alexander Reznicek, Troy, NY (US); Jingyun Zhang, Albany, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 16/355,148

(22) Filed: Mar. 15, 2019

(65) Prior Publication Data

US 2020/0295256 A1  Sep. 17, 2020

(51) Int. Cl.
  *H01L 43/12* (2006.01)
  *H01L 27/22* (2006.01)
  *H01L 43/02* (2006.01)

(52) U.S. Cl.
  CPC ............ *H01L 43/12* (2013.01); *H01L 27/222* (2013.01); *H01L 43/02* (2013.01)

(58) Field of Classification Search
  None
  See application file for complete search history.

(56) References Cited

U.S. PATENT DOCUMENTS

| | | | |
|---|---|---|---|
| 7,579,197 B1 * | 8/2009 | Li | H01L 43/08 438/3 |
| 8,482,966 B2 * | 7/2013 | Kang | G01R 33/098 365/158 |
| 8,711,612 B1 * | 4/2014 | Mani | G11C 8/00 365/171 |
| 8,803,324 B2 * | 8/2014 | Lee | H01L 23/5222 257/774 |
| 9,318,696 B2 * | 4/2016 | Lu | H01L 43/08 |
| 9,385,308 B2 * | 7/2016 | Li | H01L 43/08 |
| 9,853,087 B2 * | 12/2017 | Suh | H01L 27/222 |
| 10,043,852 B2 * | 8/2018 | Kanaya | H01L 43/08 |
| 10,056,543 B2 * | 8/2018 | Bak | H01L 43/08 |
| 10,163,976 B2 * | 12/2018 | Suh | H01L 27/222 |

(Continued)

FOREIGN PATENT DOCUMENTS

CN  108735895  11/2018

*Primary Examiner* — David E Graybill
(74) *Attorney, Agent, or Firm* — Scully, Scott, Murphy & Presser, P.C.; Daniel P. Morris, Esq.

(57) ABSTRACT

A replacement bottom electrode structure process is provided in which a patterned stack containing a MTJ pillar and a top electrode structure is fabricated and passivated on a sacrificial dielectric material plug that is embedded in a dielectric capping layer. The sacrificial dielectric material plug is then removed and replaced with a bottom electrode structure. The replacement bottom electrode structure process of the present application allows the MTJ patterning to be misalignment tolerate and fully eliminates the potential yield loss from the bottom electrode structure.

10 Claims, 9 Drawing Sheets

(56) References Cited

U.S. PATENT DOCUMENTS

| | | | |
|---|---|---|---|
| 2009/0227045 A1* | 9/2009 | Li | H01L 43/12 |
| | | | 438/3 |
| 2010/0072566 A1* | 3/2010 | Kang | H01L 43/08 |
| | | | 257/422 |
| 2011/0233696 A1* | 9/2011 | Li | G11C 11/161 |
| | | | 257/421 |
| 2013/0113111 A1* | 5/2013 | Lee | H01L 21/76897 |
| | | | 257/774 |
| 2015/0249209 A1 | 9/2015 | Lu et al. | |
| 2017/0047375 A1* | 2/2017 | Kanaya | G11C 11/161 |
| 2017/0054070 A1* | 2/2017 | Bak | H01L 43/10 |
| 2017/0069684 A1* | 3/2017 | Suh | H01L 43/12 |
| 2017/0069835 A1* | 3/2017 | Sonoda | H01L 43/12 |
| 2018/0012933 A1 | 1/2018 | Suh et al. | |
| 2020/0295256 A1* | 9/2020 | Hashemi | H01L 43/12 |

\* cited by examiner

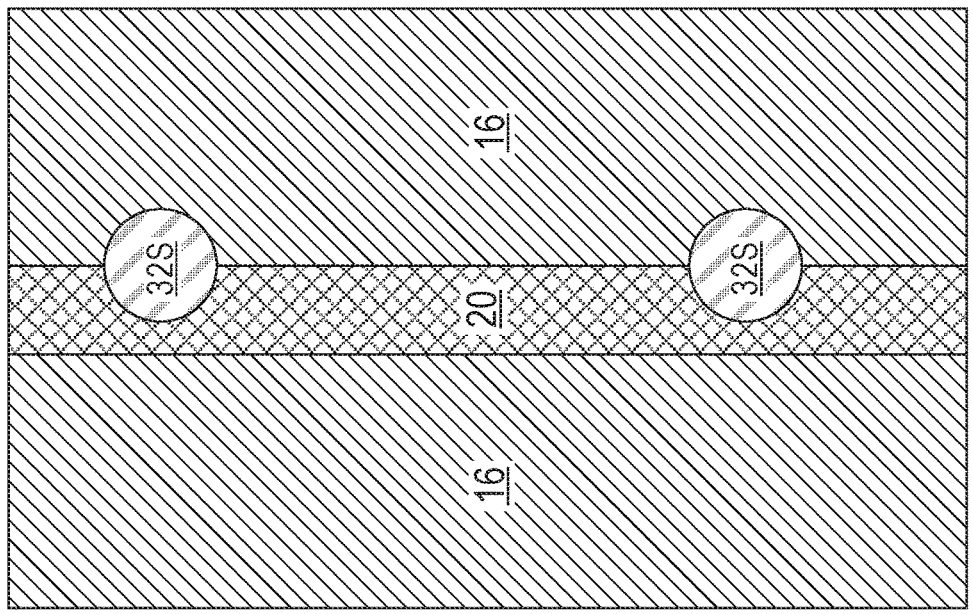
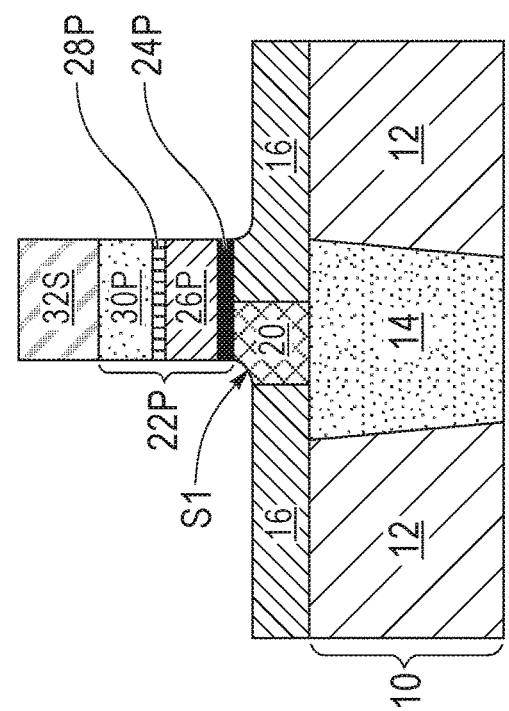
FIG. 5B
FIG. 5A

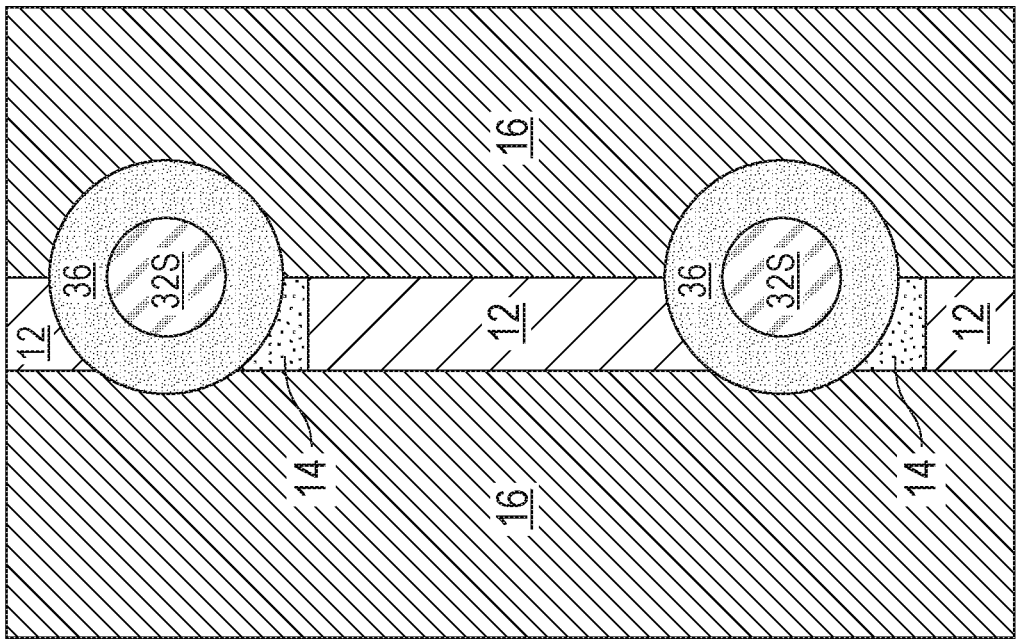
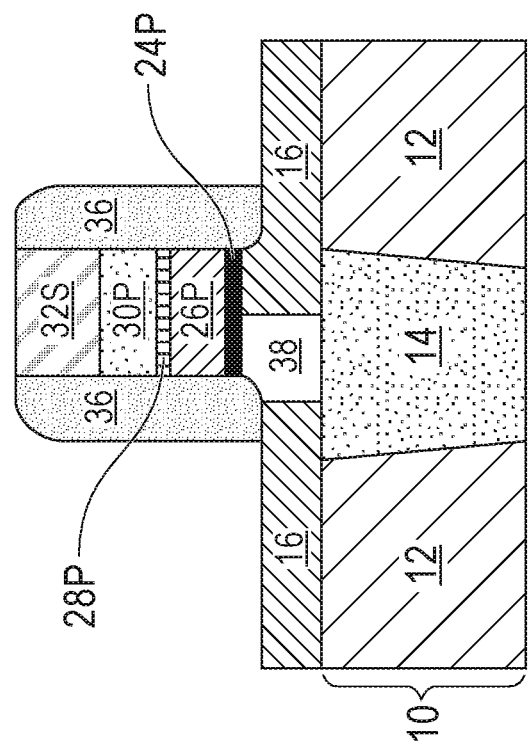
FIG. 7B
FIG. 7A

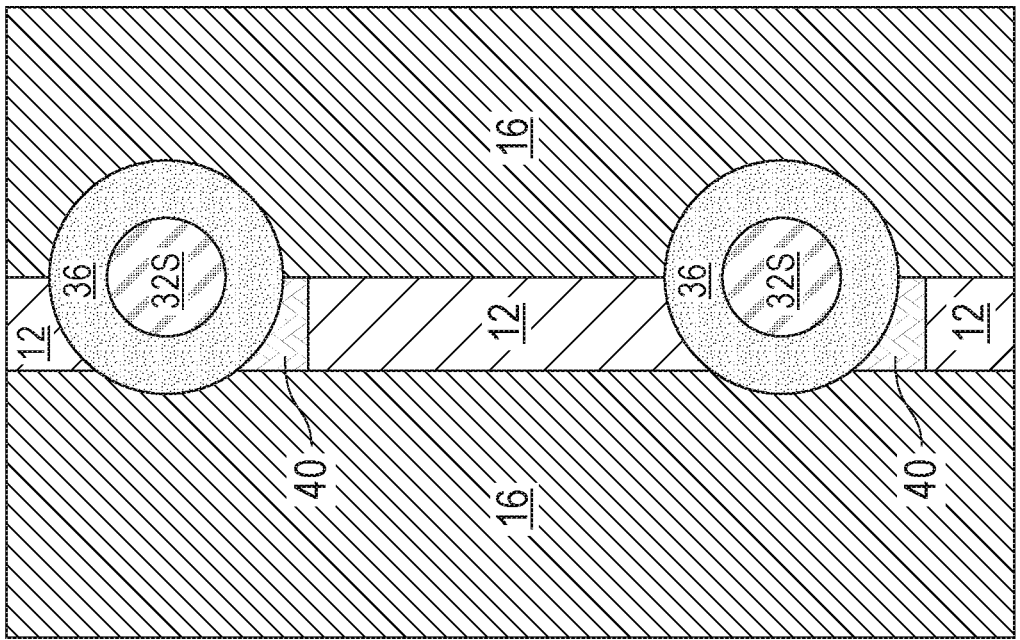
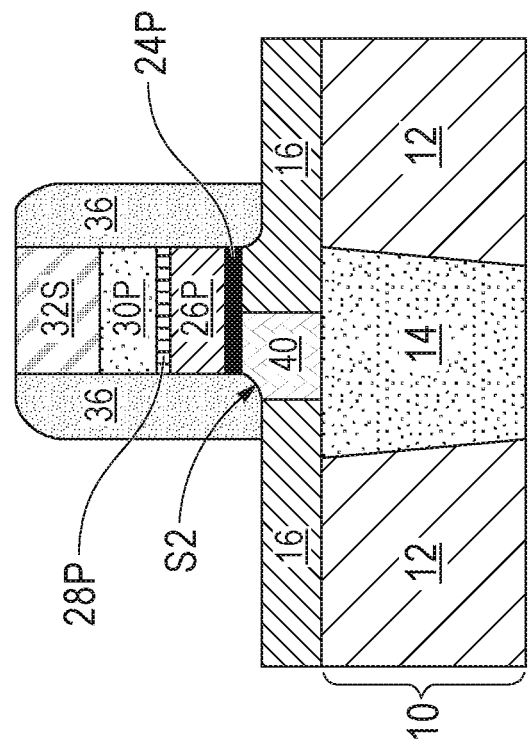
FIG. 8B
FIG. 8A

REPLACEMENT BOTTOM ELECTRODE STRUCTURE PROCESS TO FORM MISALIGNMENT TOLERATE MRAM WITH HIGH YIELD

BACKGROUND

The present application relates to a memory structure and a method of forming the same. More particularly, the present application relates to a method of forming a magnetoresistive random access memory (MRAM) that contains a misaligned multilayered tunnel junction (MTJ) pillar with high yield.

MRAM is a viable memory option for stand alone and embedded applications such as, for example, internet of things (IoT), automobile, or artificial intelligence (AI). MRAM is a non-volatile random access memory technology in which data is stored by magnetic storage elements. These elements are typically formed from two ferromagnetic plates, each of which can hold a magnetization, separated by a thin dielectric layer, i.e., the tunnel barrier layer. One of the two plates is a permanent magnetic set to a particular polarity; the other plate's magnetization be changed to match that of an external field to store memory. The permanent magnetic may be referred to as a magnetic pinned or reference layer, and the magnetic that changes magnetization to match that of an external field can be referred to as a magnetic free layer. Collectively, the magnetic pinned layer, the tunnel barrier layer and the magnetic free layer provide a multilayered tunnel junction (MTJ) pillar.

Yielding MRAM using an ion beam etch (IBE) is critical for manufacturing. Specifically, partial short yield loss can be due to resputtering of metal particles from the bottom electrode structure onto the sidewall of the tunnel barrier layer of the MTJ pillar during patterning of a MTJ material stack. In the prior art, and to avoid such resputtering, a MTJ pillar that has a larger critical dimension (CD) than the bottom electrode structure is desired such that the MTJ pillar completely covers the underlying bottom electrode structure.

Scaling of the MTJ pillar's CD is demanding for the next MRAM generations to improve switching efficiency and switching current. This make using a bottom electrode structure with a smaller CD challenging due to the unavoidable misalignment of the MTJ pillar to the bottom electrode structure, resulting in exposure of the bottom electrode structure to the IBE etch and yield loss.

SUMMARY

A replacement bottom electrode structure process is provided in which a patterned stack containing a MTJ pillar and a top electrode structure is fabricated and passivated on a sacrificial dielectric material plug that is embedded in a dielectric capping layer. The sacrificial dielectric material plug is then removed and replaced with a bottom electrode structure. The replacement bottom electrode structure process of the present application allows the MTJ patterning to be misalignment tolerate and fully eliminates the potential yield loss from the bottom electrode structure.

In one embodiment of the present application, a method of forming a memory structure is provided. In one embodiment, the method includes forming a sacrificial dielectric material plug in an opening that is present in a dielectric capping layer. The sacrificial dielectric material plug has a bottommost surface that is located on a portion of a first electrically conductive structure that is present beneath the dielectric capping layer. A MTJ pillar and a top electrode structure are formed on the sacrificial dielectric material plug. Next, a passivation material spacer is formed on sidewalls of the top electrode structure and the MTJ pillar. The sacrificial dielectric material plug is then removed from the opening that is present in the dielectric capping layer to physically expose a surface of the first electrically conductive structure. Next, a bottom electrode structure is formed on the physically exposed surface of the first electrically conductive structure.

In another embodiment of the present application, a memory structure is provided. In one embodiment of the present application, the memory structure includes a bottom electrode structure embedded in a dielectric capping layer. The bottom electrode structure forms a first interface with a first electrically conductive structure that is present beneath the dielectric capping layer. A multilayered tunnel junction (MTJ) pillar and a top electrode structure are located above, and misaligned to, the bottom electrode structure. The bottom electrode structure forms a second interface, opposite the first interface, with a bottommost portion of the MTJ pillar. A passivation material spacer is located on sidewalls of the top electrode structure and the MTJ pillar.

BRIEF DESCRIPTION OF THE DRAWINGS

FIG. 5A is a cross sectional view of the exemplary memory structure of FIG. 4A after patterning the top electrode layer and the MTJ material stack to provide a top electrode structure and a MTJ pillar, respectively.

FIG. 5B is a top down view of the exemplary memory structure shown in FIG. 5A.

FIG. 7A is a cross sectional view of the exemplary memory structure of FIG. 6A after removing the sacrificial dielectric material plug from the opening that is present in the dielectric capping layer.

FIG. 7B is a top down view of the exemplary memory structure shown in FIG. 7A.

FIG. 8A is a cross sectional view of the exemplary memory structure of FIG. 7A after forming a bottom electrode structure on a physically exposed surface of the first electrically conductive structure.

FIG. 8B is a top down view of the exemplary memory structure shown in FIG. 8A.

DETAILED DESCRIPTION

Figure 2B:
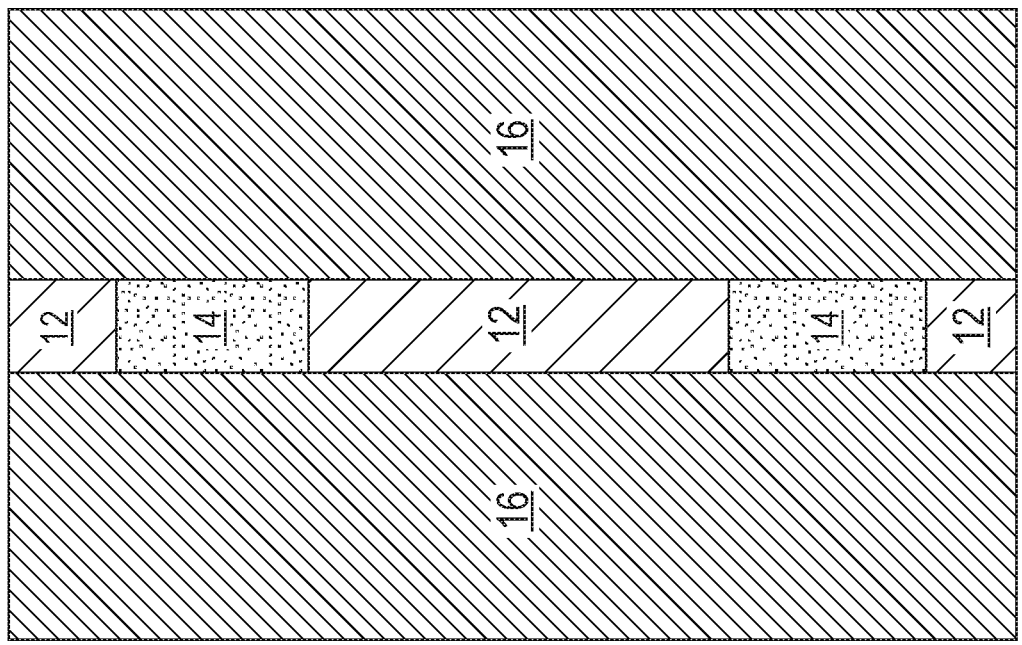
FIG. 2B is a top down view of the exemplary memory structure shown in FIG. 2A; line A-A shows the cross sectional view of FIG. 2A.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
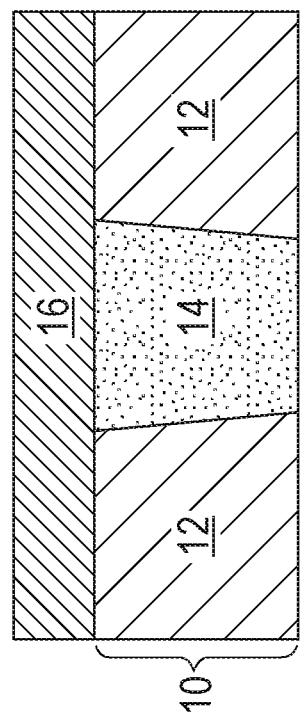
FIG. 1 is a cross sectional view of an exemplary memory structure of the present application and during an early stage of fabrication, the memory structure including a dielectric capping layer located on a surface of an interconnect level that includes a first electrically conductive structure embedded in a first interconnect dielectric material.

Referring first to FIG. 1, there is illustrated an exemplary memory structure of the present application and during an early stage of fabrication. The memory structure of FIG. 1 includes a dielectric capping layer 16 located on a surface of an interconnect level 10 that includes a first electrically conductive structure 14 embedded in a first interconnect dielectric material 12. Although the cross sectional view of FIG. 1 illustrates a single first electrically conductive structure 14 embedded in the first interconnect dielectric material 12, a plurality of spaced apart first electrically conductive structures 14 can be embedded in the first interconnect dielectric material 12. This is exemplified in the top-down drawings of the present application.

It is noted that the drawings of the present application illustrate a memory device area in which a memory device such as, for example, a MRAM device, will be formed. A non-memory device area may be located laterally adjacent to the memory device area illustrated in the drawings of the present application.

The first interconnect dielectric material 12 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first electrically conductive structure 14 is composed of an electrically conductive metal or metal alloy. Examples of electrically conductive materials that can be used in the present application include copper (Cu), aluminum (Al), or tungsten (W), while an example of an electrically conductive metal alloy is a Cu—Al alloy. The first electrically conductive structure 14 typically has a topmost surface that is coplanar with a topmost surface of the first interconnect dielectric material 12. The first electrically conductive structure 14 can be cylindrical in shape; although other asymmetric shapes are possible and can be used in the present application as the shape of the first electrically conductive structure 14. The first electrically conductive structure 14 can have a vertical sidewall or, and as shown in FIG. 1, the first electrically conductive structure 14 can have a tapered sidewall.

In some embodiments, a diffusion barrier liner (not shown) is formed along the sidewall and a bottom wall of the first electrically conductive structure 14. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

The interconnect level 10, including the first interconnect dielectric material 12, the first electrically conductive structure 14, and, if present, the diffusion barrier liner can be formed utilizing conventional processes that are well-known to those skilled in the art. So as to not obscure the method of the present application, the techniques used to form the interconnect level 10 are not provided herein. In one embodiment, a damascene process can be used in forming interconnect level 10. It is noted that at least one other interconnect level and/or a middle-of-the-line (MOL) level can be located beneath the interconnect level 10. These other levels are not shown for clarity.

After forming the interconnect level 10, the dielectric capping layer 16 is formed on the physically exposed topmost surface of both the first interconnect dielectric material 12 and the first electrically conductive structure 14. The dielectric capping layer 16 can be composed of any dielectric material such as, for example, silicon carbide, silicon nitride, silicon dioxide, a carbon doped oxide, a nitrogen and hydrogen doped silicon carbide SiC(N,H) or multilayers thereof. The dielectric capping layer 16 is a continuous layer that can be formed utilizing a conventional deposition process such as, for example, chemical vapor deposition (CVD), plasma enhanced chemical vapor deposition (PECVD), chemical solution deposition, evaporation, or atomic layer deposition (ALD). The dielectric capping layer 16 can have a thickness from 10 nm to 50 nm. Although other thicknesses for the dielectric capping layer 16 can be used in the present application besides the thickness range specified herein.

Figure 2A:
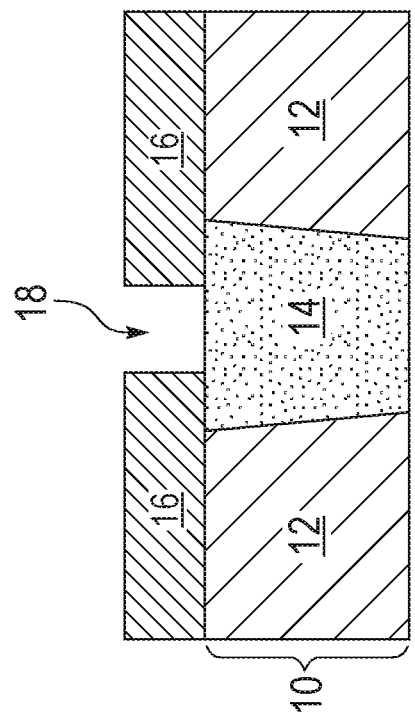
FIG. 2A is a cross sectional view of the exemplary memory structure of FIG. 1 after forming an opening in the dielectric capping layer that physically exposes a portion of the first electrically conductive structure.

Referring now to FIGS. 2A and 2B, there are shown the exemplary memory structure of FIG. 1 after forming an opening 18 in the dielectric capping layer 16 that physically exposes a portion of the first electrically conductive structure 14; the opening 18 can also physically expose a surface of the first interconnect dielectric material 12 that is located between a neighboring pair of first electrically conductive structures 14 (See, FIG. 2B). In FIGS. 2A and 2B, and in one embodiment, the opening 18 defines a bar structure.

The opening 18 can be formed by lithography and etching. Lithography includes forming a photoresist material on a surface of a material or a material stack that needs to be patterned. The photoresist material is then exposed to a pattern of irradiation. The exposed photoresist material is then developed utilizing a conventional resist developer. The etching can include a dry etching process, a wet chemical etching process or a combination thereof.

Figure 3B:
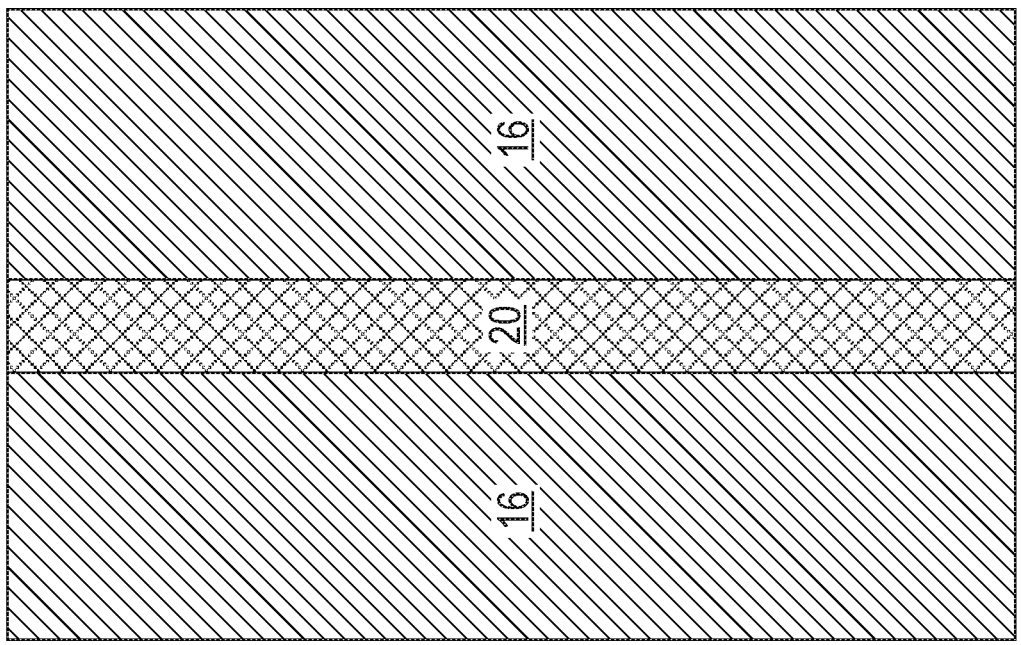
FIG. 3B is a top down view of the exemplary memory structure shown in FIG. 3A.
Figure 3A:
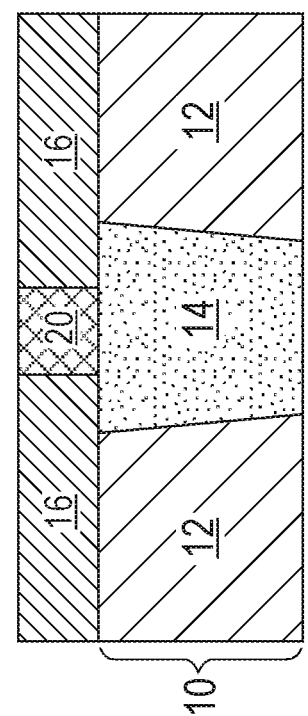
FIG. 3A is a cross sectional view of the exemplary memory structure of FIG. 2A after forming a sacrificial dielectric material plug in the opening and on the physically exposed portion of the first electrically conductive structure.

Referring now to FIGS. 3A-3B, there are illustrated the exemplary memory structure of FIGS. 2A-2B, after forming a sacrificial dielectric material plug 20 in the opening 18 and on the physically exposed portion of the first electrically conductive structure 14 and, if physically exposed, a portion of the first interconnect dielectric material 12. In the exemplified embodiment, the sacrificial dielectric material plug 20 is in the form of a bar.

The sacrificial dielectric material plug 20 can be composed of any dielectric material whose etch rate is different from the etch rate of the first interconnect dielectric material 12, the dielectric capping layer 16, and the passivation material spacer 26 to be subsequently formed. In one example, the sacrificial dielectric material plug 20 can be composed of silicon dioxide or aluminum oxide. The dielectric material that provides the sacrificial dielectric material plug 20 can be formed by a deposition process such as, for example, chemical vapor deposition (CVD), plasma enhanced chemical vapor deposition (PECVD), chemical solution deposition, evaporation, or atomic layer deposition (ALD). In some embodiments, a planarization process such as, for example, chemical mechanical polishing (CMP), can follow the deposition of the dielectric material that provides the sacrificial dielectric material plug 20. As is shown in FIG. 3A, the sacrificial dielectric material plug 20 typically has a topmost surface that is coplanar with a topmost surface of the dielectric capping layer 16.

Figure 4B:
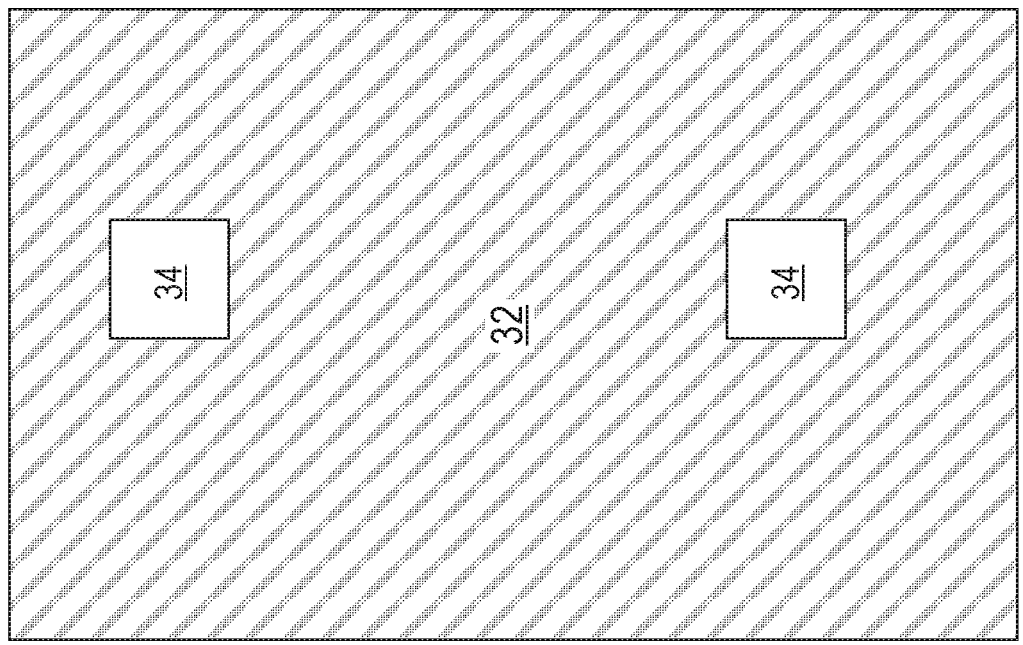
FIG. 4B is a top down view of the exemplary memory structure shown in FIG. 4A.
Figure 4A:
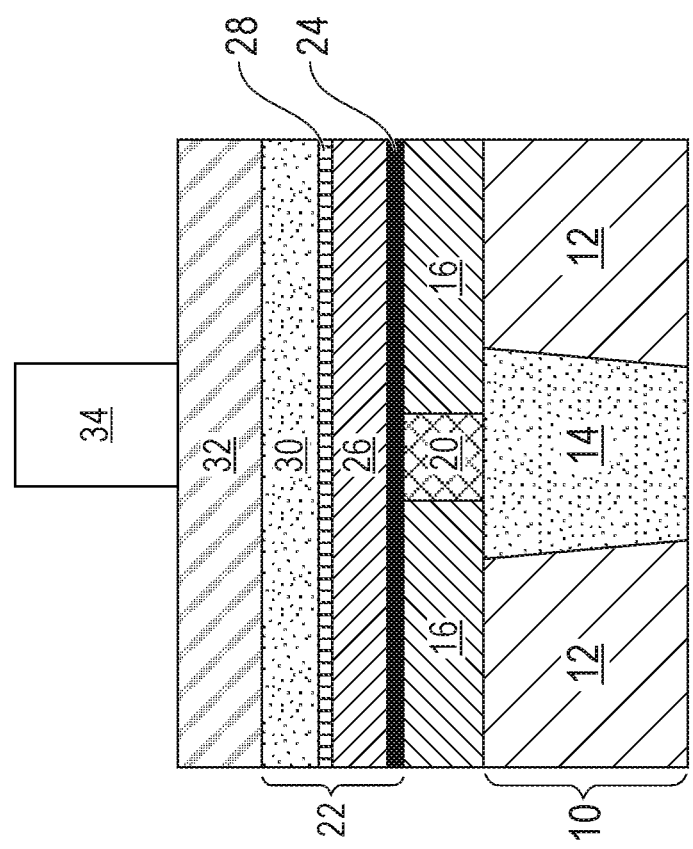
FIG. 4A is a cross sectional view of the exemplary memory structure of FIG. 3A after forming a MTJ material stack, a top electrode layer, and a patterned mask.

Referring now to FIGS. 4A-4B, there are illustrated the exemplary memory structure of FIGS. 3A-3B after forming a MTJ material stack 22, a top electrode layer 32, and a patterned mask 34.

The MTJ material stack 22 includes at least a magnetic pinned layer, a tunnel barrier layer, and a magnetic free layer. In some embodiments and as shown in FIG. 3A, the MTJ material stack 22 is a bottom pinned MTJ material stack that includes, from bottom to top, a magnetic pinned layer 26, a tunnel barrier layer 28, and a magnetic free layer 30. An optional metal seed layer 24 can also be present in the bottom pinned MTJ material stack. In the bottom pinned MTJ material stack, the metal seed layer 24 is formed beneath the magnetic pinned layer 26. The bottom pinned MTJ material stack can also include a non-magnetic spacer layer (not shown) located on the magnetic free layer 30, a second magnetic free layer (not shown) located on the non-magnetic spacer layer, and/or a MTJ cap layer (not shown) located on the magnetic free layer 30 or on the second magnetic free layer.

In other embodiments (not shown), the MTJ material stack 22 is a top pinned MTJ material stack that includes, from bottom to top, a magnetic free layer, a tunnel barrier layer, and a magnetic pinned layer. In such an embodiment, the top pinned MTJ material stack can also include a metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack 22 can be formed by utilizing one or more deposition processes such as, for example, sputtering, plasma enhanced atomic layer deposition (PEALD), plasma enhanced chemical vapor deposition (PECVD) or physical vapor deposition (PVD).

The optional metal seed layer 24 can be composed of platinum (Pt), palladium (Pd), nickel (Ni), rhodium (Rh), iridium (Ir), rhenium (Re) or alloys and multilayers thereof. In one example, the metal seed layer 24 is composed of platinum (Pt).

The magnetic pinned layer 26 has a fixed magnetization. The magnetic pinned layer 26 can be composed of a metal or metal alloy (or a stack thereof) that includes one or more metals exhibiting high spin polarization. In alternative embodiments, exemplary metals for the formation of the magnetic pinned layer 26 include iron, nickel, cobalt, chromium, boron, or manganese. Exemplary metal alloys can include the metals exemplified by the above. In another embodiment, the magnetic pinned layer 26 can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer 26.

The tunnel barrier layer 28 is composed of an insulator material and is formed at such a thickness as to provide an appropriate tunneling resistance. Exemplary materials for the tunnel barrier layer 28 include magnesium oxide, aluminum oxide, and titanium oxide, or materials of higher electrical tunnel conductance, such as semiconductors or low-bandgap insulators.

The magnetic free layer 30 can be composed of a magnetic material (or a stack of magnetic materials) with a magnetization that can be changed in orientation relative to the magnetization orientation of the magnetic pinned layer 26. Exemplary magnetic materials for the magnetic free layer 30 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer 30. In one embodiment, the second magnetic free layer is composed of a same magnetic material as the magnetic free layer 30. In another embodiment, the second magnetic free layer is composed of a magnetic material that is compositionally different from the magnetic free layer 30.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer can have a thickness from 2 nm to 25 nm; other thicknesses are possible and can be used in the present application as the thickness of the MTJ cap layer.

The top electrode layer 32 can be composed of a conductive material such as, for example, Ta, TaN, Ti, TiN, Ru, RuN, RuTa, RuTaN, Co, CoWP, CoN, W, WN or any combination thereof. In one embodiment of the present application, top electrode layer 32 is composed of Ti/TiN. In the present application, the top electrode layer 32 can have a thickness that is from 100 nm to 500 nm; although other thicknesses are possible and can be used as the thickness of the top electrode layer 32. The top electrode layer 32 can be formed by a deposition process such as, for example, sputtering, plasma enhanced atomic layer deposition (PEALD), plasma enhanced chemical vapor deposition (PECVD) or physical vapor deposition (PVD).

The patterned mask 34 can be composed of a photolithographic resist stack. The patterned mask 34 is typically formed to be misaligned to the underlying sacrificial dielectric material plug 20. In one embodiment, the photolithographic resist stack that provides the patterned mask 34 can include a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask 34. The transferring can include one or more etching processes.

Referring now to FIGS. 5A-5B, there are shown the exemplary memory structure of FIGS. 4A-4B after patterning the top electrode layer 32 and the MTJ material stack 22 to provide a top electrode structure 32S and a MTJ pillar 22P, respectively. Patterning of the top electrode layer 32 and the MTJ material stack 22 can include first patterning the top electrode layer 32 utilizing a first etching process such as, for example, a reactive ion etch. The remaining, i.e., non-patterned, portion of the top electrode layer 32 provides the top electrode structure 32S. The top electrode structure 32S can be cylindrical in shape; although other asymmetric shapes are possible and can be used in the present application as the shape of the top electrode structure 32S. The critical dimension (CD) of the top electrode structure 32S can vary and is not critical in the present application.

After patterning the top electrode layer 32, the patterned mask 34 is removed from atop the top electrode structure 32S that is formed utilizing conventional processes well-known to those skilled in the art. The patterning of the MTJ material stack 22 is then performed utilizing an ion beam etch (IBE) in which the top electrode structure 32S is employed as a patterned mask. The remaining, i.e., non-patterned, portion of the MTJ material stack 22 provides the MTJ pillar 22P. In one example, the MTJ pillar 22P, includes metal seed layer portion 24P, a magnetic pinned material layer portion 26P, a tunnel barrier layer portion 28P, and a magnetic free layer portion 30P. The MTJ pillar 22P can include remaining portions of any other layer that is present in the MTJ material stack 22. The MTJ pillar 22P can be cylindrical in shape; although other asymmetric shapes are possible and can be used in the present application as the shape of the MTJ pillar 22P; the MTJ pillar 22P and the top electrode structure 32 have a same shape. The critical dimension (CD) of the MTJ pillar 22P can vary and is not critical in the present application. The CD of the MTJ pillar 22P is typically the same as the CD of the top electrode structure 32S.

During the IBE, a physically exposed portion of the sacrificial dielectric material plug 20 and a physically exposed portion of the dielectric capping layer 16 can be removed, as shown in FIG. 5A. After the IBE, the sacrificial dielectric material plug 20 has a concave surface, S1, as shown in FIG. 5A.

It is noted that resputtering of conductive material particles from an underlying bottom electrode structure is not a problem in the present application, since no bottom electrode structure composed of a conductive material is present beneath the MTJ pillar 22P. The MTJ pillar 22P can be a bottom pinned MTJ structure, or a top pinned MTJ structure.

As is shown in FIGS. 5A-5B, the top electrode structure 32S and the MTJ pillar 22P are misaligned to the underlying sacrificial dielectric material plug 20 such that the top electrode structure 32S and the MTJ pillar 22P extend beyond an outermost edge of the underlying sacrificial dielectric material plug 20.

Figure 6B:
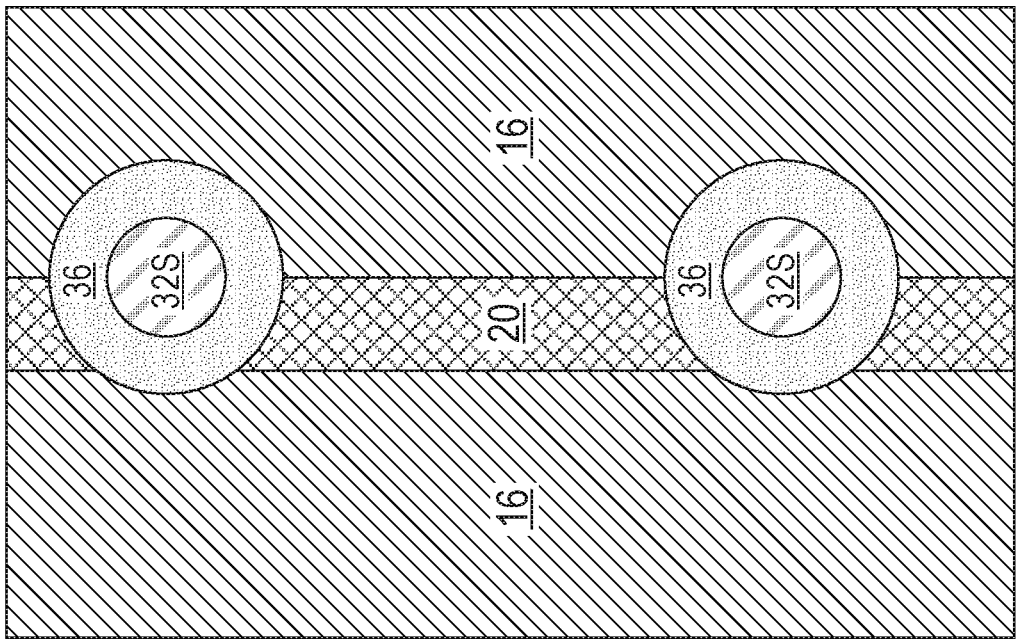
FIG. 6B is a top down view of the exemplary memory structure shown in FIG. 6A.
Figure 6A:
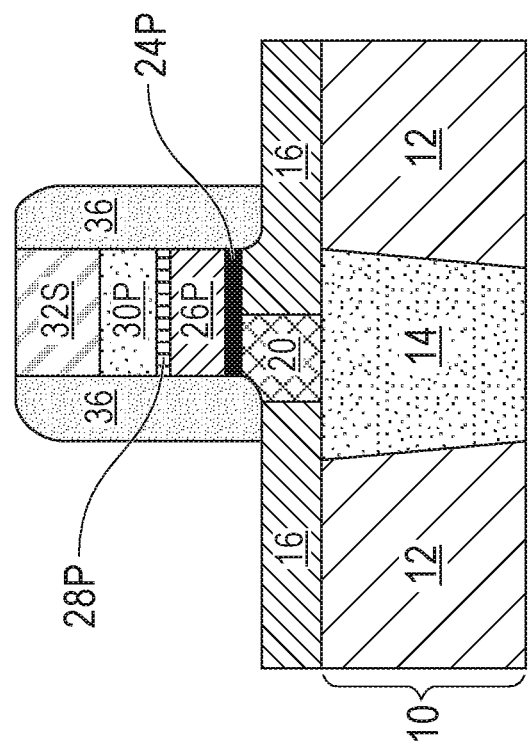
FIG. 6A is a cross sectional view of the exemplary memory structure of FIG. 5A after forming a passivation material spacer on the sidewalls of the top electrode structure and the MTJ pillar.

Referring now to FIGS. 6A-6B, there are shown the exemplary memory structure of FIGS. 5A-5B after forming a passivation material spacer 36 on the sidewalls of the top electrode structure 32S and the MTJ pillar 22P. The passivation material spacer 36 laterally surrounds the top electrode structure 32S and the MTJ pillar 22P. The passivation material spacer 36 is present on the concave surface, S1, of the sacrificial dielectric material plug 20 and on a portion of the dielectric capping layer 16.

The passivation material spacer 36 is composed of a dielectric material that is compositionally different from the dielectric material of the sacrificial dielectric material plug 20 and the dielectric capping layer 16. In one embodiment, the passivation material spacer 36 is composed of silicon nitride. In another embodiment, the passivation material spacer 36 can be composed of a dielectric material that contains atoms of silicon, carbon and hydrogen. In some embodiments, and in addition to atoms of carbon and hydrogen, the dielectric material that provides the passivation material spacer 36 can include atoms of at least one of nitrogen and oxygen. In other embodiments, and in addition to atoms of silicon, nitrogen, carbon and hydrogen, the dielectric material that provides the passivation material spacer 36 can include atoms of boron. In one example, the passivation material spacer 36 can be composed of an nBLOK dielectric material that contains atoms of silicon, carbon, hydrogen, nitrogen and oxygen. In alternative example, the passivation material spacer 36 can be composed of a SiBCN dielectric material that contains atoms of silicon, boron, carbon, hydrogen, and nitrogen.

The passivation material spacer 36 can be formed by a deposition, followed by a spacer etch such as, for example, reactive ion etching. The passivation material spacer 36 can have a thickness from 10 nm to 200 nm. Other thicknesses are possible and can be employed as the thickness of the passivation material spacer 36. The passivation material spacer 36 typically has a topmost surface that is coplanar with a topmost surface of the top electrode structure 32S.

Referring now to FIGS. 7A-7B, there are illustrated the exemplary memory structure of FIGS. 6A-6B after removing the sacrificial dielectric material plug 20 from the opening 18 that is present in the dielectric capping layer 16. The passivation material spacer 36 serves an anchoring element during the removal of the sacrificial dielectric material plug 20. Void 38 is formed after the removal of the sacrificial dielectric material plug 20. In the embodiment shown in FIG. 7B, void 38 physically exposes a portion of the first interconnect dielectric material 12 and the first electrically conductive structure 14.

The sacrificial dielectric material plug 20 can be removed utilizing an etching process that is selective in removing the sacrificial dielectric material plug 20 relative to the passivation material spacer 36, the top electrode structure 32S, the dielectric capping layer 16, the first interconnect dielectric material 12 and the first electrically conductive structure 14. In one example, and when the sacrificial dielectric material plug 20 is composed of silicon nitride, dilute hydrofluoric acid can be used as a chemical etchant to remove the sacrificial dielectric material plug 20 from the structure.

Figure 8C:
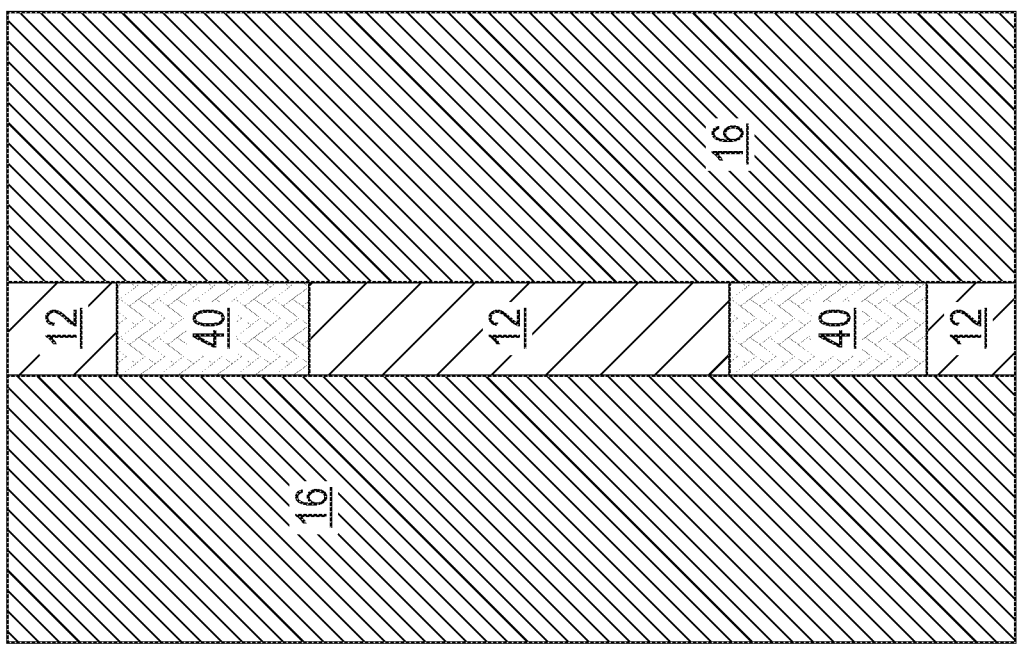
FIG. 8C is a top down view of the exemplary memory structure of FIG. 8A starting from the dielectric capping layer downward.

Referring now to FIGS. 8A-8B, there are shown the exemplary memory structure of FIGS. 7A-7B after forming a bottom electrode structure 40 on a physically exposed surface of the first electrically conductive structure 12. FIG. 8C illustrates a top down view of the exemplary memory structure of FIG. 8A starting from the dielectric capping layer 13 downward.

The bottom electrode structure 40 is composed of one of the conductive material mentioned above for the top electrode layer 32 (and hence the top electrode structure 32S). In one embodiment, the bottom electrode structure 40 is composed of a conductive material that is compositionally the same as the conductive material that provides the top electrode 32 (and hence the top electrode structure 32S). In another embodiment, the bottom electrode structure 40 is composed of a conductive material that is compositionally different from the conductive material that provides the top electrode 32 layer (and hence the top electrode structure 32S).

The bottom electrode structure 40 is formed utilizing a selective deposition in which the conductive material that provides the bottom electrode structure 40 grows only on, and upwards from, the physically exposed surface of the first electrically conductive structure 14. The bottom electrode structure 40 has a bottommost surface that forms an interface with the physically exposed surface (i.e., topmost surface) of the first electrically conductive structure 14, and a topmost surface that forms an interface with a bottommost portion of the MTJ pillar 22P. The bottom electrode structure 40 is misaligned to the MTJ pillar 22P and the top electrode structure 32S. Notably, a portion of the bottom electrode structure 40 extends beyond an outermost edge of the MTJ pillar 22P and the top electrode structure 32S such that a portion of a bottommost surface of the MTJ pillar 22P is present on the dielectric capping layer 16. No re-sputtered metal particles deposit on the sidewall of the MTJ pillar 22P during the replacement process used in the present application. As is shown in the drawings, the bottom electrode structure 40 has a curved surface S1 that contacts a portion of the passivation material spacer 36.

In some embodiments, the selective deposition that is used in forming the bottom electrode structure 40 includes chemical vapor deposition (CVD) or atomic layer deposition (ALD). The bottom electrode structure 40 is self-aligned in at least one direction to the underlying first electrically conductive structure 14. In the illustrated embodiment, the bottom electrode structure 40 has a bar shape. As is shown in FIG. 8C, the bottom electrode structure 40 is separated from a nearest neighboring bottom electrode structure 40 by a gap; the gap physically exposes a portion of the underlying first interconnect dielectric material 12.

FIGS. 8A-8C (and the remaining drawings to follow) illustrate a memory structure in accordance with the present application. The memory structure includes a bottom electrode structure 40 embedded in a dielectric capping layer 16. The bottom electrode structure 40 forms a first interface with a first electrically conductive structure 14 that is present beneath the dielectric capping layer 16. A multilayered tunnel junction (MTJ) pillar 22P and a top electrode structure 32S are located above, and misaligned to, the bottom electrode structure 40. The bottom electrode structure 40 forms a second interface, opposite the first interface, with a bottommost portion of the MTJ pillar 22P. A passivation material spacer 36 is located on sidewalls of the top electrode structure 32S and the MTJ pillar 22P.

Figure 9:
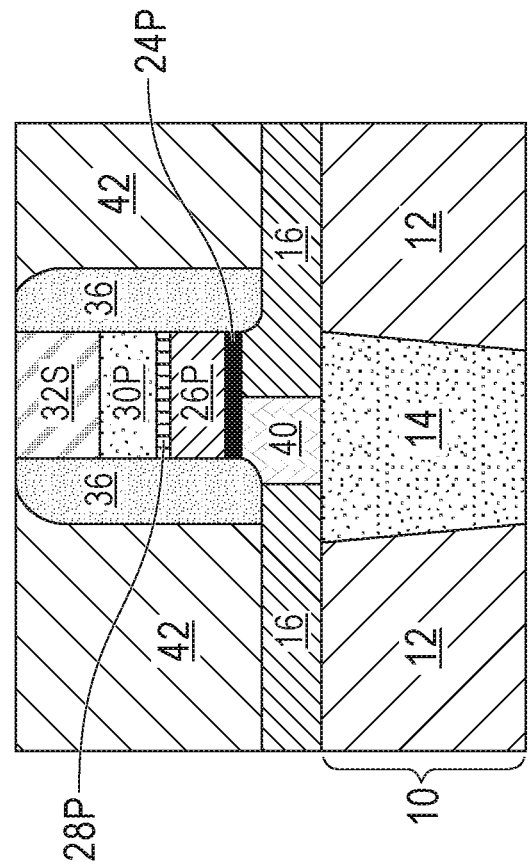
FIG. 9 is a cross sectional view of the exemplary memory structure of FIG. 8A after forming a second interconnect dielectric material laterally adjacent to the passivation material spacer.

Referring now to FIG. 9, there is illustrated the exemplary memory structure of FIGS. 8A-8C after forming a second interconnect dielectric material 42 laterally adjacent to the passivation material spacer 36. The second interconnect dielectric material 42 fills in the gap that is present between a neighboring pair of bottom electrode structures 40, and is present on physically exposed topmost surface of the dielectric capping layer 16. The second interconnect dielectric material 42 has a topmost surface that is coplanar with a topmost surface of the passivation material spacer 36, and a topmost surface of the top electrode structure 32S.

The second interconnect dielectric material 42 can include one of the dielectric materials mentioned above for the first interconnect dielectric material 12. In one embodiment, the second interconnect dielectric material 42 is composed of a dielectric material that is compositionally the same as the dielectric material that provides the first interconnect dielectric material 12. In another embodiment, the second interconnect dielectric material 42 is composed of a dielectric material that is compositionally different from the dielectric material that provides the first interconnect dielectric material 12. The second interconnect dielectric material 42 can be formed utilizing a conventional deposition process including, for example, chemical vapor deposition (CVD), plasma enhanced chemical vapor deposition (PECVD) or spin-on coating. A planarization process such as, for example, chemical mechanical polishing (CMP), can follow the deposition of the dielectric material that provides the second interconnect dielectric material 42.

Figures 10A, 10B:
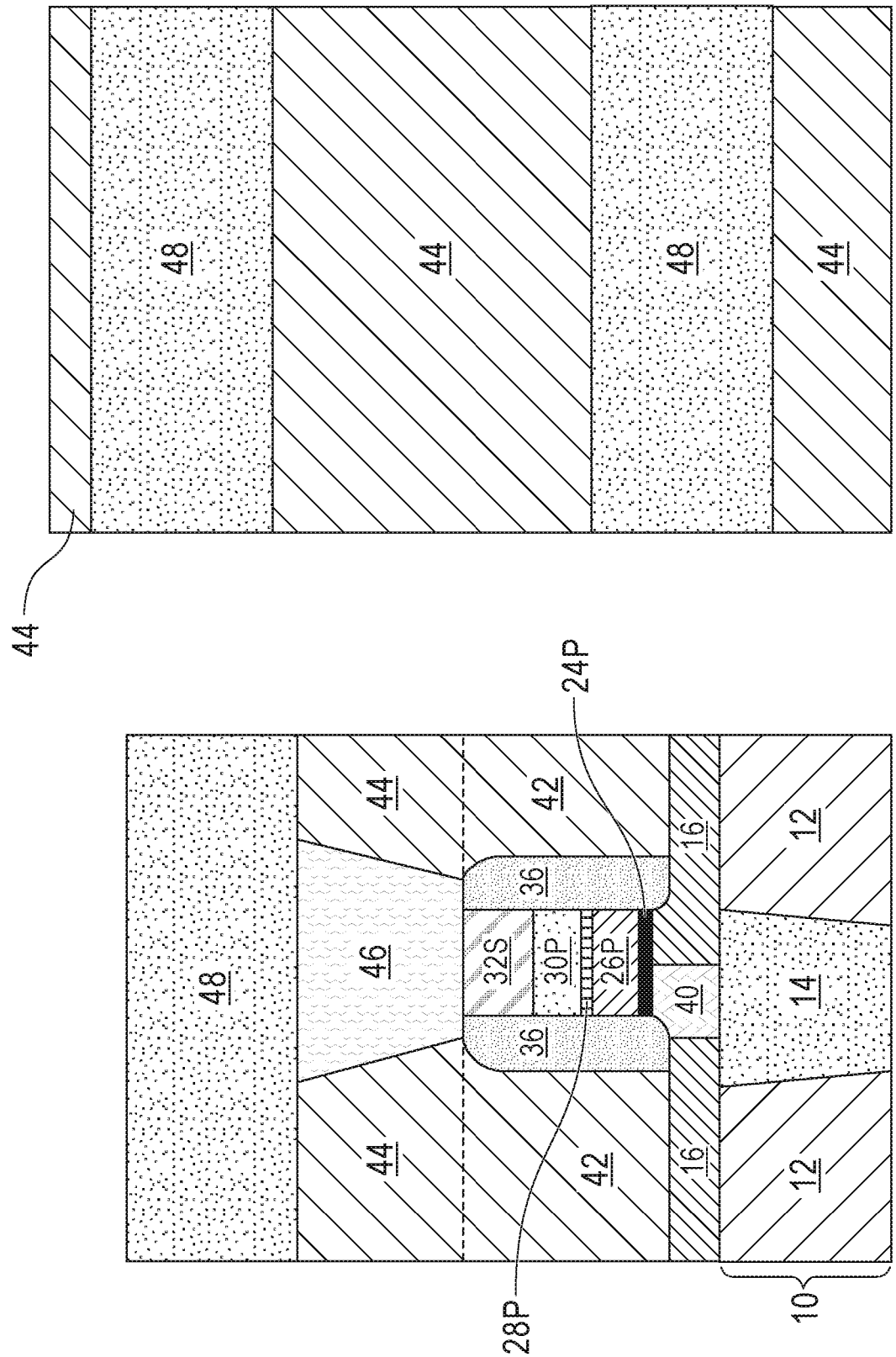
FIG. 10A is cross sectional view of the exemplary memory structure of FIG. 9 after forming a contact level including a second electrically conductive structure embedded in a third interconnect dielectric material, and forming a bitline on a portion of the contact level.
FIG. 10B is a top down view of the exemplary memory structure shown in FIG. 10A.

Referring now to FIGS. 10A-10B, there are illustrated the exemplary memory structure of FIG. 9 after forming a contact level including a second electrically conductive structure 46 embedded in a third interconnect dielectric material 44, and forming a bitline 48 on a portion of the contact level (44, 46). As is shown, the second electrically conductive structure 46 contacts a surface of the top electrode structure 32S. The second dielectrically conductive structure 46 can have vertical sidewalls or sidewalls that are tapered. The second electrically conductive structure 46 has a topmost surface that is coplanar with a topmost surface of the third interconnect dielectric material 44.

The third interconnect dielectric material 44 can include one of the dielectric materials mentioned above for the second interconnect dielectric material 42. In one embodiment, the third interconnect dielectric material 42 is composed of a dielectric material that is compositionally the same as the dielectric material that provides the second interconnect dielectric material 42. In another embodiment, the third interconnect dielectric material 44 is composed of a dielectric material that is compositionally different from the dielectric material that provides the second interconnect dielectric material 42. In FIG. 10A, the dotted line represents a possible material interface that can be present between the third interconnect dielectric material 44 and the second interconnect dielectric material 42. The third interconnect dielectric material 44 can be formed utilizing a conventional deposition process including, for example, chemical vapor deposition (CVD), plasma enhanced chemical vapor deposition (PECVD) or spin-on coating. A planarization process such as, for example, chemical mechanical polishing (CMP), can follow the deposition of the dielectric material that provides the third interconnect dielectric material 44.

The second electrically conductive structure 46 can include one of the electrically conductive metals or metal alloys mentioned above for the first electrically conductive structure 12. In one embodiment, the second electrically conductive structure 46 is composed of a same electrically conductive metal or metal alloy as the first electrically conductive structure 12. In another embodiment, the second electrically conductive structure 46 is composed of an electrically conductive metal or metal alloy that is compositionally different from the first electrically conductive structure 12.

The second electrically conductive structure 46 can be formed by first forming an opening into the third interconnect dielectric material 44 that physically exposes a surface of the top electrode structure 32S. The opening that is formed into the second electrically conductive structure 46 can be formed utilizing lithography and etching, as defined above. Next, and in some embodiments (not shown), a layer of a diffusion barrier material, as defined above, is then formed into the opening. The layer of diffusion barrier material can be formed utilizing a conventional deposition process such as, for example, chemical vapor deposition (CVD) or plasma enhanced chemical vapor deposition (PECVD). The layer of diffusion barrier material does not completely fill in the opening. Instead, the layer of diffusion barrier material lines the sidewalls and bottom wall of the opening that is formed into the third interconnect dielectric material 44. In some embodiments, the layer of diffusion barrier material is omitted. The electrically conductive metal or metal alloy that provides the second electrically conductive structure 46 is formed into the opening, with or without, the layer of diffusion barrier material utilizing a conventional deposition process. A planarization process typically follows the deposition of the electrically conductive metal or metal alloy.

The bitline 48 can include one of the electrically conductive metals or metal alloys mentioned above for the first electrically conductive structure 12. In one embodiment, the bitline 48 is composed of a same electrically conductive metal or metal alloy as the second electrically conductive structure 46. In another embodiment, the bitline 48 is composed of an electrically conductive metal or metal alloy that is compositionally different from the second electrically conductive structure 46. The bitline 48 can be formed by deposition of a layer of an electrically conductive metal or metal alloy, followed by patterning the layer of electrically conductive metal or metal alloy. Patterning can be performed by lithography and etching, as defined above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a memory structure, the method comprising:
    forming a sacrificial dielectric material plug in an opening that is present in a dielectric capping layer, wherein the sacrificial dielectric material plug has a bottommost surface that is located on a portion of a first electrically conductive structure that is present beneath the dielectric capping layer;
    forming a multilayered tunnel junction (MTJ) pillar and a top electrode structure on the sacrificial dielectric material plug;
    forming a passivation material spacer on sidewalls of the top electrode structure and the MTJ pillar;
    removing the sacrificial dielectric material plug from the opening that is present in the dielectric capping layer to physically expose a surface of the first electrically conductive structure; and
    forming a bottom electrode structure on the physically exposed surface of the first electrically conductive structure.

2. The method of claim 1, wherein the forming of the bottom electrode structure comprises a selective deposition process, and wherein the bottom electrode structure has a bottommost surface that forms an interface with the physically exposed surface of the first electrically conductive structure, and a topmost surface that forms an interface with a bottommost portion of the MTJ pillar.

3. The method of claim 1, wherein a first portion of both the MTJ pillar and the top electrode structure extends beyond a sidewall of the sacrificial dielectric material plug, and a second portion of both the MTJ pillar and the top electrode structure are located directly above the sacrificial dielectric material plug.

4. The method of claim 1, wherein a first portion of the bottom electrode structure extends beyond a sidewall of both the MTJ pillar and the top electrode structure, and a second portion of the bottom electrode structure is located directly beneath both the MTJ pillar and the top electrode structure.

5. The method of claim 1, further comprising forming a second electrically conductive structure in contact with a surface of the top electrode structure.

6. The method of claim 5, wherein the second electrically conductive structure is formed in an interconnect dielectric material that is formed above the top electrode structure.

7. The method of claim 5, further comprising forming a bitline on a surface of the second electrically conductive structure.

8. The method of claim 1, wherein the MTJ pillar comprises a bottom pinned MTJ material structure.

9. The method of claim 1, wherein the MTJ pillar comprises a top pinned MTJ material structure.

10. The method of claim 1, wherein no re-sputtered metal particles are present on the sidewalls of the MTJ pillar.

\* \* \* \* \*